US005827752A

United States Patent [19]

Ju et al.

[11] Patent Number: 5,827,752

[45] Date of Patent: Oct. 27, 1998

[54] MICRO-TIP FOR EMITTING ELECTRIC FIELD AND METHOD FOR FABRICATING THE SAME

[75] Inventors: Byeong Kwon Ju; Myung Hwan Oh, both of Seoul, Rep. of Korea

[73] Assignee: Korea Institute of Science and Technology, Seoul, Rep. of Korea

[21] Appl. No.: 686,131

[22] Filed: Jul. 23, 1996

[30] Foreign Application Priority Data

Oct. 24, 1995 [KR] Rep. of Korea .................. 1995-36760

[51] Int. Cl.[6] ............................ H01L 21/00; H01L 21/02

[52] U.S. Cl. ............................................ 438/20; 438/105

[58] Field of Search ........................................ 438/20, 105

[56] References Cited

U.S. PATENT DOCUMENTS 5,628,659 5/1997 Xie et al. .................................... 445/3

OTHER PUBLICATIONS

Geis et al., "Diamond Cold Cathode", *IEEE Electron Device Letters,* 12:456–459 (Aug., 1991).

Xu et al., "Field–Dependence of the Area–Density of 'Cold' Electron Emission Sites on Board–Area CVD Diamond Films", *Electronics Letters,* 29:1596–1597 (Sep. 2, 1993).

Okano et al., "Fabrication of a Miniature–Size Pyramidal–Shape Diamond Field Emitter Array", *IEEE Electron Device Letters,* 16:239–241 (Jun., 1995).

Holloway et al., "Production and Control of vacuum in field emission flat panel displays", *Solid State Technology,* pp. 47–54 (Aug., 1995).

Huang et al., "Silicon Wafer Bonding for Sealed Vacuum Microelectronic Devices", pp. 159–163.

*Primary Examiner*—Douglas W. Robinson
*Assistant Examiner*—Everett White
*Attorney, Agent, or Firm*—Townsend and Townsend and Crew

[57] ABSTRACT

A micro-tip for emitting an electric field and a method for fabricating the same are disclosed. The method includes the steps of: forming a silicon mould; forming a functional layer on the silicon mould, and then forming a tip on the functional layer; forming a conductive thin film on one side of the tip; bonding a substrate to the conductive thin film; and removing the silicon mould, to thereby obtain the structural advantages of the semiconductor tip as well as the advantages of the material for functional layer, and realize the micro-tip for an emitting electric field having high reliability.

7 Claims, 5 Drawing Sheets

MICRO-TIP FOR EMITTING ELECTRIC FIELD AND METHOD FOR FABRICATING THE SAME

BACKGROUND OF THE INVENTION

The present invention relates to a micro-tip for emitting an electric field and a method for fabricating the same, and more particularly, to a micro-tip on which a functional layer is coated using different silicon moulds.

For a material of tip for emitting an electric field, metal or semiconductor like silicon has been widely used. However, studies on a technique in which functional layers having various advantages are coated on the surface of the tip for the field emitting portion have been recently carried out. For example, in case that a diamond thin film is coated on the surface of a silicon tip, it is possible to obtain the advantage of the diamond as well as the structural advantage of the silicon tip. That is, the work function of a tip on which the diamond is coated is so low that electrons are emitted easily. Also, the tip is chemically stable and mechanically strong, and has a high thermal conductivity.

However, in case that a functional layer having a specific function is coated on the tip, it is difficult for the coated layer to follow the shape of the tip. That is, it is difficult for the coated layer to be controlled to maintain its sharpness like the tip. Accordingly, when the functional layer is coated on the tip, a structural change, such as bluntness of the tip, may occur.

SUMMARY OF THE INVENTION

It is an object of the present invention to provide a micro-tip for emitting an electric field and a method for fabricating the same in which a silicon substrate is etched to form a mould structure, and then a functional layer is formed using the mould structure, to thereby minimize the structural change of the tip caused by the deposition of the functional layer.

To accomplish the object of the present invention, there is provided a micro-tip for emitting an electric field including a substrate; a conductive thin film formed on the substrate; a tip formed on the conductive thin film; and a functional layer formed on the tip and having the same shape as that of the surface of the tip.

For the object of the present invention, there is further provided a method for a method for fabricating a micro-tip for emitting an electric field, the method including the steps of: forming a silicon mould; forming a functional layer on the silicon mould, and then forming a tip on the functional layer; forming a conductive thin film on one side of the tip; bonding a substrate to the conductive thin film; and removing the silicon mould.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

A preferred embodiment of the present invention will be explained below with reference to the accompanying drawings.

The present invention is designed to prevent a tip from becoming blunt because of the deposition of a functional layer having a specific function on the tip. For this, a silicon substrate is etched to form a mould structure, and then a functional layer like diamond and a material for the tip are sequentially formed on the mould structure. Successively, a substrate is bonded to the mould on which the functional layer and tip are formed, and then the mould is removed, to thereby form the tip on which the functional layer is coated.

Figure 1:
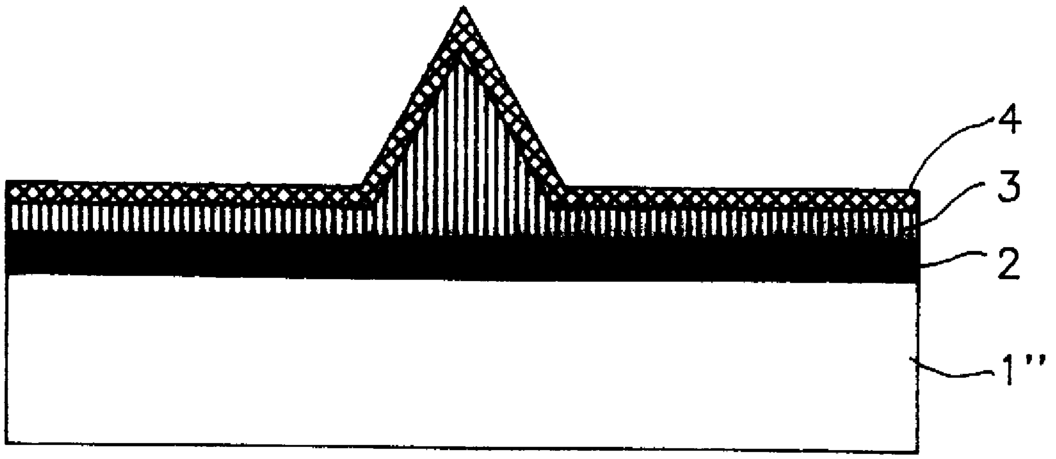
FIG. 1 is a cross-sectional view of a micro-tip for emitting an electric field in accordance with the present invention.

FIG. 1 is a cross-sectional view showing the fundamental structure of the aforementioned tip. That is, a conductive thin film 2 for cathode is formed on a substrate 1" formed of glass, silicon or metal, and a tip 3 formed of metal or semiconductor is formed on conductive thin film 2. A functional layer 4 like diamond, which follows the shape of tip 3, is coated on tip 3. A method for fabricating the micro-tip having the above structure will be explained below with reference to FIGS. 2A to 2F.

Figure 2A:
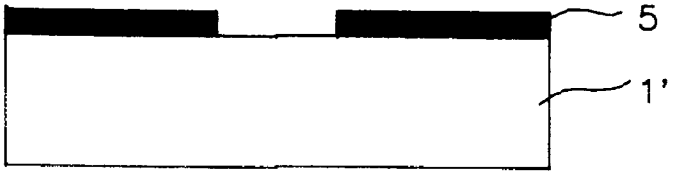
FIGS. 2A to 2F are cross-sectional views which show the process of forming the micro-tip depicted in FIG. 1.
Figure 2B:
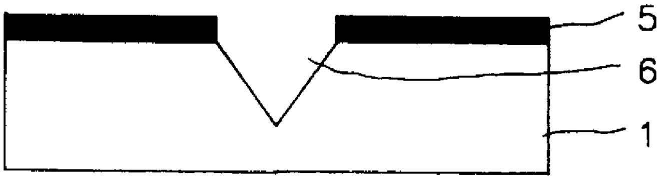

As shown in FIG. 2A, an etch mask 5 patterned into a form like rectangle or square is formed on a single-crystalline silicon substrate 1 to be aligned to a specific orientation face of the substrate 1. Then, silicon substrate 1 is orientation-dependent etched using etch mask 1, to thereby form a groove 6 formed with specific orientation face as shown in FIG. 2B. This silicon substrate on which groove 6 is formed is used as a mould.

Figure 2C:
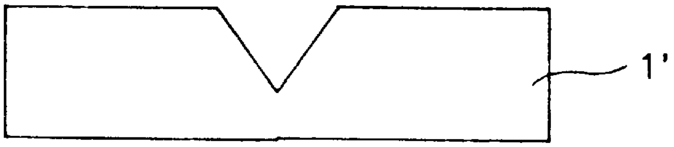
Figure 2D:
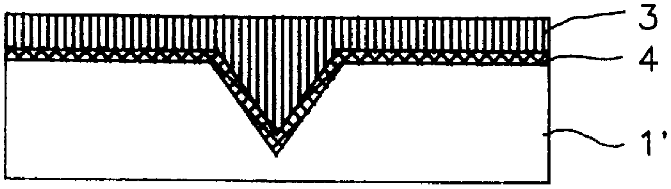

As shown in FIG. 2C, etch mask 5 is removed to form mould 1', and as shown in FIG. 2D, a functional layer 4 is coated on mould 1'. As a result, the coated functional layer 4 has the same form as that of mould 1'. Then, a tip 3 is formed on functional layer 4 using a thin film deposition, printing or electro-plating method.

Figure 2E:
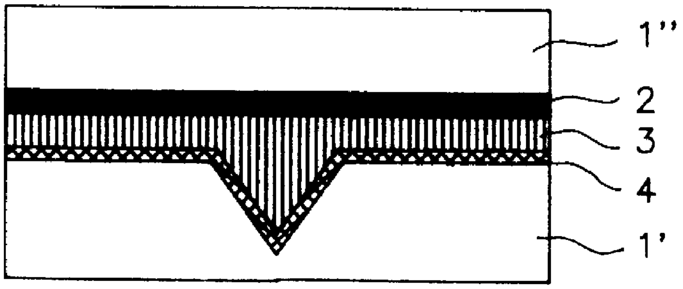
Figure 2F:
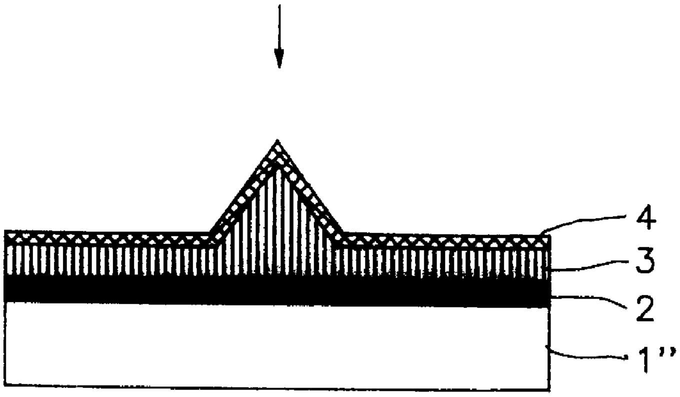

As shown in FIG. 2E, a conductive thin film 2 is formed on tip 3 as a metal layer used as a cathode, and a substrate 1" formed of glass, semiconductor or metal is bonded to conductive thin film 2 using metallic bonding. Then, as shown in FIG. 2F, silicon mould 1' is removed through wet etch, accomplishing the micro-tip on which the functional layer is coated. Here, the shape of the bottom of the groove may be controlled according to the characteristic of the functional layer to be coated thereon through etching of a silicon, oxidation of the etched silicon, and removing of an oxide layer formed by the oxidation. This will be explained below in detail.

Figure 3A:
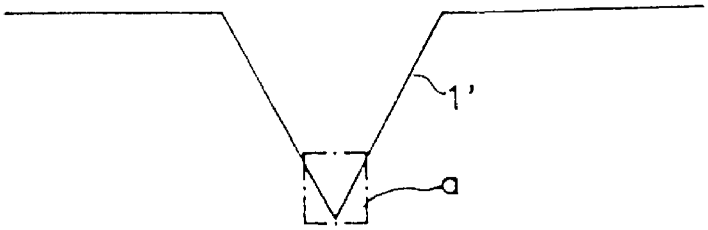
FIGS. 3A, 3B and 3C are cross-sectional views of different silicon mould structures fabricated according to the present invention.
Figure 3B:
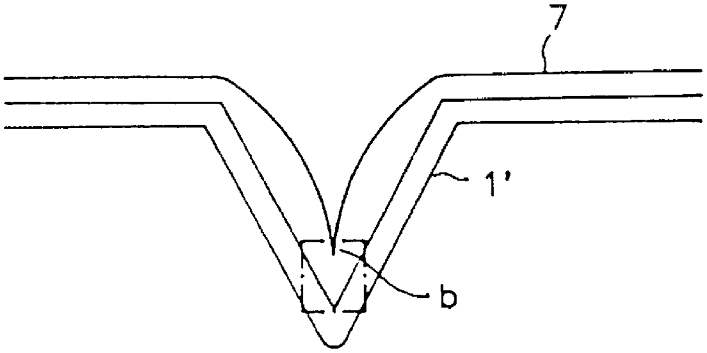
Figure 3C:
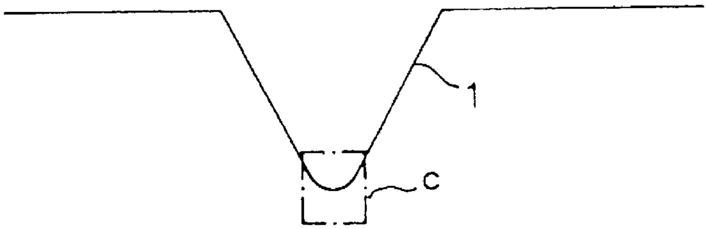
Figure 4A:
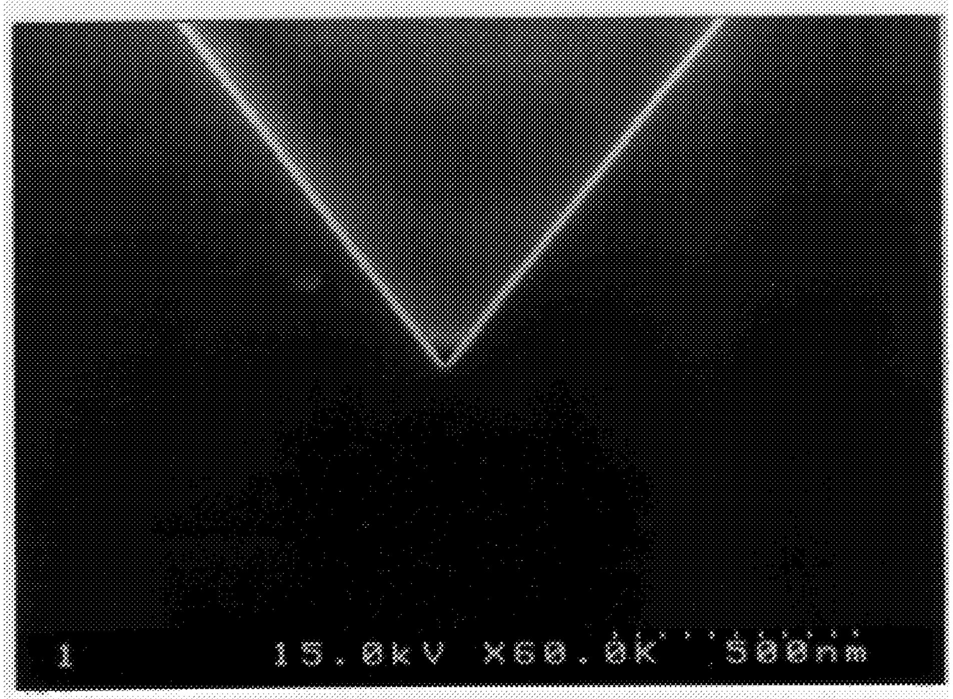
FIGS. 4A, 4B and 4C show SEM scan of silicon mould structures having shapes different from one another of FIGS. 3A, 3B and 3C.
Figure 4B:
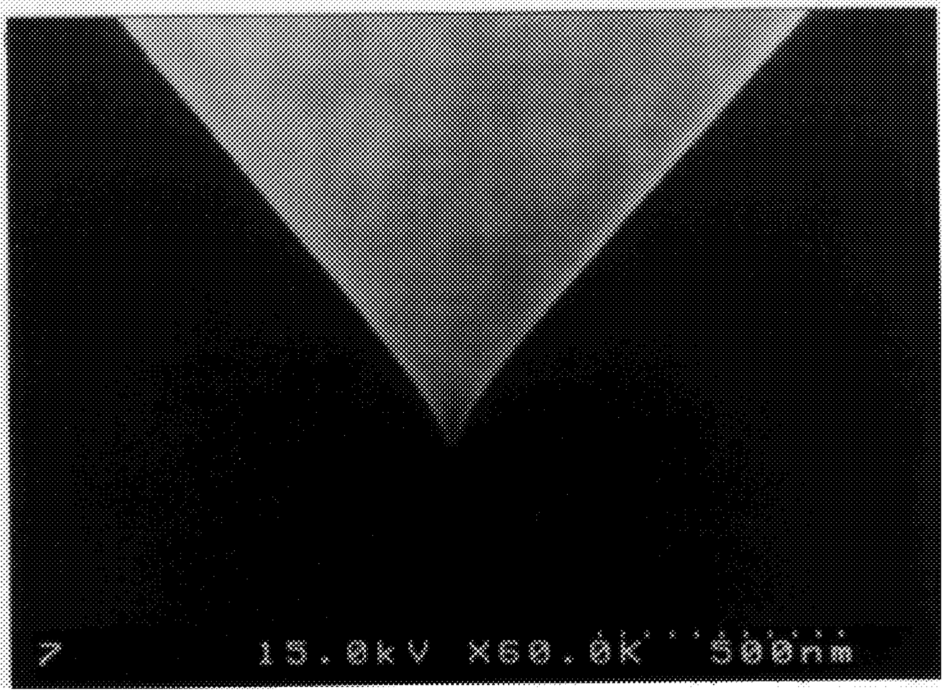
Figure 4C:
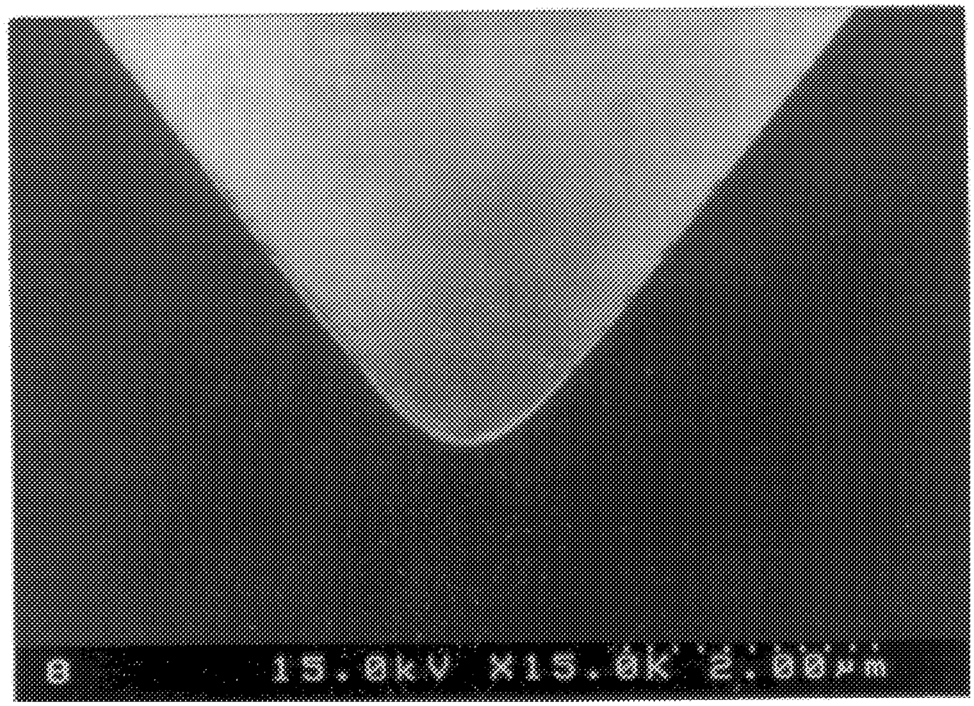

FIGS. 3A and 4A are a cross-sectional view and picture of the silicon mould formed through etching of the silicon, respectively, and FIGS. 3B and 4B are a cross-sectional view and picture of the silicon mould formed through etching of the silicon and growing of thermal oxide layer, respectively. FIGS. 3C and 4C are a cross-sectional view and picture of the silicon mould formed through etching of the silicon, growing of thermal oxide layer and removing of the thermal oxide layer, respectively.

The silicon mould structure of FIG. 3A is formed in a manner that the etch mask is aligned on (100) silicon substrate perpendicularly or in parallel to (100) orientation face of the substrate, and then the substrate is orientation-dependent etched using ethylene diamine pyrazine water (EPW). Here, the angle of about 70.5° C. is formed at the bottom (a) of the etched portion of the silicon. FIG. 4A shows the picture of the silicon mould of FIG. 3A.

FIG. 3B shows a case that silicon mould 1' of FIG. 3A is heat-treated in an oxygen ambient in a furnace to form thermal oxide layer 7 thereon, to thereby more sharpen the bottom (b) of the etched portion of the silicon. FIG. 4B shows the picture of the silicon mould on which about 500 nm-thick thermal oxide layer is formed.

FIG. 3C shows a case that thermal oxide layer 7 placed on silicon mould 1' of FIG. 3A is removed using buffered HF solution, to thereby round the bottom (C) of the etched portion of the silicon. FIG. 4C shows the picture of the silicon mould structure of FIG. 3C. Here, the reason why bottom of the mould is formed with round shape will be explained below. When the functional layer is formed using a material like diamond, the material can not fill the sharp portion of the tip due to the characteristic of the layer, resulting in forming a space in the portion. This makes the tip's shape vague. Thus, the electrical characteristic of the tip is remarkably deteriorated. The purpose of the present invention is to solve this problem.

According to the present invention, the functional layer and tip are formed using the silicon mould so that the shape of the functional layer is formed to model the shape of the tip. By doing so, it is possible to obtain the structural advantages of the semiconductor tip as well as the advantages of the material for functional layer. Also, since the shape of the mould can be controlled in various forms, for example, sharp or round form, the shape of the mould can be flexibly selected according to the coating method of the functional layer. As a result, the micro-tip for emitting an electric field having high reliability is realized.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed:

1. A method for fabricating a micro-tip for emitting an electric field, said method comprising the steps of:

forming a silicon mould;

forming a functional layer on said silicon mould, and then forming a tip on said functional layer;

forming a conductive thin film on one side of said tip;

bonding a substrate to said conductive thin film; and removing said silicon mould.

2. The method for fabricating a micro-tip for emitting an electric field as claimed in claim 1, wherein said step for forming said silicon mould comprises the steps of:

forming an etch mask on said semiconductor substrate perpendicularly or in parallel to (100) orientation of said semiconductor substrate;

orientation-dependent etching said silicon substrate using said etch mask, to form a groove; and removing said etch mask.

3. The method for fabricating a micro-tip for emitting an electric field as claimed in claim 2, wherein said step for forming said silicon mould further comprises the step of growing a thermal oxide layer on said silicon mould through heat treatment in an oxygen ambient, after the step of removing said etch mask.

4. The method for fabricating a micro-tip for emitting an electric field as claimed in claim 3, wherein said step for forming said silicon mould further comprises the step of removing said thermal oxide layer, after the step of growing said thermal oxide layer.

5. The method for fabricating a micro-tip for emitting an electric field as claimed in claim 1, wherein said tip is formed through one of thin film deposition, printing and electroplating.

6. The method for fabricating a micro-tip for emitting an electric field as claimed in claim 1, wherein said tip is formed of semiconductor or metal.

7. The method for fabricating a micro-tip for emitting an electric field as claimed in claim 1, wherein said substrate bonded to said conductive thin film is formed of semiconductor, glass or metal.

* * * * *